United States Patent
Lee

(10) Patent No.: US 10,176,880 B1
(45) Date of Patent: Jan. 8, 2019

(54) SELECTIVE BODY RESET OPERATION FOR THREE DIMENSIONAL (3D) NAND MEMORY

(71) Applicant: Intel Corporation, Santa Clara, CA (US)

(72) Inventor: Changhyun Lee, Boise, ID (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 15/640,518

(22) Filed: Jul. 1, 2017

(51) Int. Cl.
*G11C 16/34* (2006.01)
*G11C 16/10* (2006.01)
*G11C 11/56* (2006.01)

(52) U.S. Cl.
CPC ...... *G11C 16/3427* (2013.01); *G11C 11/5628* (2013.01); *G11C 16/10* (2013.01)

(58) Field of Classification Search
CPC ..... G11C 11/5628; G11C 16/16; G11C 16/08; G11C 11/5642
USPC .................................................. 365/185.03
See application file for complete search history.

(56) References Cited

U.S. PATENT DOCUMENTS

| | | | |
|---|---|---|---|
| 5,784,319 | A | 7/1998 | Villa et al. |
| 7,023,736 | B2 | 4/2006 | Cernea et al. |
| 7,057,931 | B2 | 6/2006 | Lutze et al. |
| 7,626,866 | B2 | 12/2009 | Aritome et al. |
| 7,869,261 | B2 | 1/2011 | Ozawa |
| 7,893,084 | B2 | 2/2011 | Beaulieu et al. |
| 7,898,317 | B2 | 3/2011 | Choi |
| 7,920,431 | B2 | 4/2011 | Nobunaga et al. |
| 7,995,400 | B2 | 8/2011 | Sarin |
| 8,068,364 | B2 | 11/2011 | Maejima |
| 8,102,711 | B2 | 1/2012 | Maejima |

(Continued)

FOREIGN PATENT DOCUMENTS

| | | |
|---|---|---|
| CN | 1832046 A | 9/2006 |
| CN | 101364440 A | 2/2009 |

(Continued)

OTHER PUBLICATIONS

Cernea et al.; "A 34MB/s-Program-Throughput 16Gb MLC NAND with All-Bitline Architecture in 56nm"; In: IEEE International Solid-State Circuits Conference, ISSCC 2008; Digest of Technical Papers; (Feb. 3-7, 2008); pp. 420-421, 624; Session 23, Non-Volatile Memory 23.1; San Francisco, CA, USA; IEEE; <doi: 10.1109/ISSCC.2008.4523236 >.

(Continued)

*Primary Examiner* — Hoai V Ho
*Assistant Examiner* — Minh Dinh
(74) *Attorney, Agent, or Firm* — Thorpe North & Western, LLP; David W. Osborne

(57) ABSTRACT

Technology for a memory device is described. The memory device can include a plurality of memory cells and a memory controller. The memory controller can apply a first voltage level to a selected wordline associated with the plurality of memory cells during a body reset operation. The memory controller can apply a second voltage level to an unselected wordline associated with the plurality of memory cells during the body reset operation. The selected wordline can transit to a stable negative pillar potential, such that selected memory cells associated with the selected wordline can have a reduced threshold voltage instability.

21 Claims, 10 Drawing Sheets

(56) References Cited

U.S. PATENT DOCUMENTS

| | | |
|---|---|---|
| 8,120,952 B2 | 2/2012 | Han |
| 8,194,453 B2 | 6/2012 | Maejima |
| 8,243,518 B2 | 8/2012 | Oh et al. |
| 8,976,594 B2 | 3/2015 | Tanzawa |
| 8,995,188 B2 | 3/2015 | Tanzawa |
| 9,064,551 B2 | 6/2015 | Tanzawa |
| 9,064,577 B2 | 6/2015 | Zhao et al. |
| 9,224,477 B2 | 12/2015 | Tanzawa |
| 9,349,470 B2 | 5/2016 | Tanzawa |
| 9,536,618 B2 | 1/2017 | Zhao et al. |
| 9,773,564 B2 | 9/2017 | Tanzawa |
| 9,881,686 B2 | 1/2018 | Zhao et al. |
| 2001/0004327 A1 | 6/2001 | Dallabora et al. |
| 2004/0125629 A1 | 7/2004 | Scheuerlein et al. |
| 2005/0101236 A1 | 5/2005 | Wang et al. |
| 2005/0254302 A1 | 11/2005 | Noguchi |
| 2006/0034137 A1 | 2/2006 | Zanardi |
| 2006/0034140 A1 | 2/2006 | Ogawa |
| 2006/0072359 A1 | 4/2006 | Futatsuyama et al. |
| 2006/0083066 A1 | 4/2006 | Hasegawa et al. |
| 2006/0146608 A1 | 7/2006 | Fasoli et al. |
| 2007/0047633 A1 | 3/2007 | Tung et al. |
| 2007/0076509 A1 | 4/2007 | Zhang |
| 2007/0217263 A1 | 9/2007 | Fasoli et al. |
| 2007/0230253 A1 | 10/2007 | Kim |
| 2008/0023747 A1 | 1/2008 | Park et al. |
| 2009/0040832 A1 | 2/2009 | Park |
| 2009/0116285 A1 | 5/2009 | Youn |
| 2009/0267128 A1 | 10/2009 | Maejima |
| 2010/0124116 A1 | 5/2010 | Maeda et al. |
| 2011/0013458 A1 | 1/2011 | Seol |
| 2011/0058427 A1 | 3/2011 | Choi et al. |
| 2011/0069550 A1 | 3/2011 | Maejima |
| 2011/0157978 A1 | 6/2011 | Shinozaki et al. |
| 2011/0164452 A1 | 7/2011 | Parker |
| 2011/0199829 A1 | 8/2011 | Lee et al. |
| 2011/0267887 A1 | 11/2011 | Sekar et al. |
| 2011/0273945 A1 | 11/2011 | Donkoh |
| 2011/0280085 A1 | 11/2011 | Damle et al. |
| 2012/0147648 A1 | 6/2012 | Scheuerlein |
| 2012/0147673 A1 | 6/2012 | Nakamura et al. |
| 2012/0281471 A1 | 11/2012 | Hung et al. |
| 2013/0308385 A1 | 11/2013 | Tanzawa |
| 2013/0308387 A1 | 11/2013 | Tanzawa |
| 2014/0133238 A1 | 5/2014 | Rhie |
| 2014/0160851 A1 | 6/2014 | Zhao et al. |
| 2014/0313828 A1 | 10/2014 | Tanzawa |
| 2015/0179273 A1 | 6/2015 | Tanzawa |
| 2015/0262673 A1 | 9/2015 | Tanzawa |
| 2015/0287472 A1 | 10/2015 | Zhao et al. |
| 2016/0093391 A1* | 3/2016 | Shim .................. G11C 16/26 365/185.22 |
| 2016/0267998 A1 | 9/2016 | Tanzawa |
| 2016/0307630 A1* | 10/2016 | Choo .................. G11C 16/26 |
| 2017/0075593 A1* | 3/2017 | Kim .................. G06F 3/0616 |
| 2017/0110198 A1 | 4/2017 | Zhao et al. |
| 2017/0352426 A1 | 12/2017 | Tanzawa |

FOREIGN PATENT DOCUMENTS

| | | |
|---|---|---|
| CN | 102467966 A | 5/2012 |
| CN | 102800361 A | 11/2012 |
| CN | 105144298 A | 12/2015 |
| CN | 105229745 A | 1/2016 |
| EP | 1720168 A1 | 11/2006 |
| KR | 10-20090000319 A | 1/2009 |
| KR | 20150134438 A | 12/2015 |
| KR | 101643518 B1 | 7/2016 |
| TW | 201432698 A | 8/2014 |
| TW | 201511012 A | 3/2015 |
| TW | I502593 B | 10/2015 |
| WO | WO 2014089338 A1 | 6/2014 |
| WO | WO 2014172262 A1 | 10/2014 |

OTHER PUBLICATIONS

Katsumata et al.; "Pipe-shaped BiCS flash memory with 16 stacked layers and multi-level-cell operation for ultra high density storage"; In: Symposium on VLSI Technology; Technology Digest of Technical Papers; (Jun. 16-18, 2009); pp. 136-137; Honolulu, HI, USA; IEEE; <ISBN: 978-1-4244-3308-7>.

Tanaka et al.; "Bit Cost Scalable Technology with Punch and Plug Process for Ultra High Density Flash Memory"; In: Symposium on VLSI Technology; (Jun. 12-14, 2007); pp. 14-15; Kyoto, Japan; IEEE; <doi: 10.1109/VLSIT.2007.4339708>.

Villa et al.; "A 65 nm 1 Gb 2b/cell NOR Flash With 2.25 MB/s Program Throughput and 400 MB/s DDR Interface"; IEEE Journal of Solid-State Circuits; (Jan. 2008); pp. 132-140; vol. 43, No. 1; <doi:.10.1109/JSSC.2008.916028>.

* cited by examiner

SELECTIVE BODY RESET OPERATION FOR THREE DIMENSIONAL (3D) NAND MEMORY

BACKGROUND

Memory devices are typically provided as internal, semiconductor, integrated circuits in computers or other electronic devices. There are many different types of memory including volatile memory, for example, dynamic random access memory (DRAM) and synchronous dynamic random access memory (SDRAM), and non-volatile memory, for example, flash memory.

Flash memory devices typically use a one-transistor memory cell that allows for high memory densities, high reliability, and low power consumption. Changes in threshold voltage of the cells, through programming of a charge storage node (e.g., a floating gate or charge trap) determine the data state of each cell. Other non-volatile memories such as phase change (PRAM) use other physical phenomena such as a physical material change or polarization to determine the data state of each cell. Common uses for flash and other solid state memories include personal computers, personal digital assistants (PDAs), digital cameras, digital media players, digital recorders, games, appliances, vehicles, wireless devices, cellular telephones, and removable portable memory modules among others. The uses for such memory continue to expand.

BRIEF DESCRIPTION OF THE DRAWINGS

Features and advantages of invention embodiments will be apparent from the detailed description which follows, taken in conjunction with the accompanying drawings, which together illustrate, by way of example, invention features; and, wherein.

Figure 1:
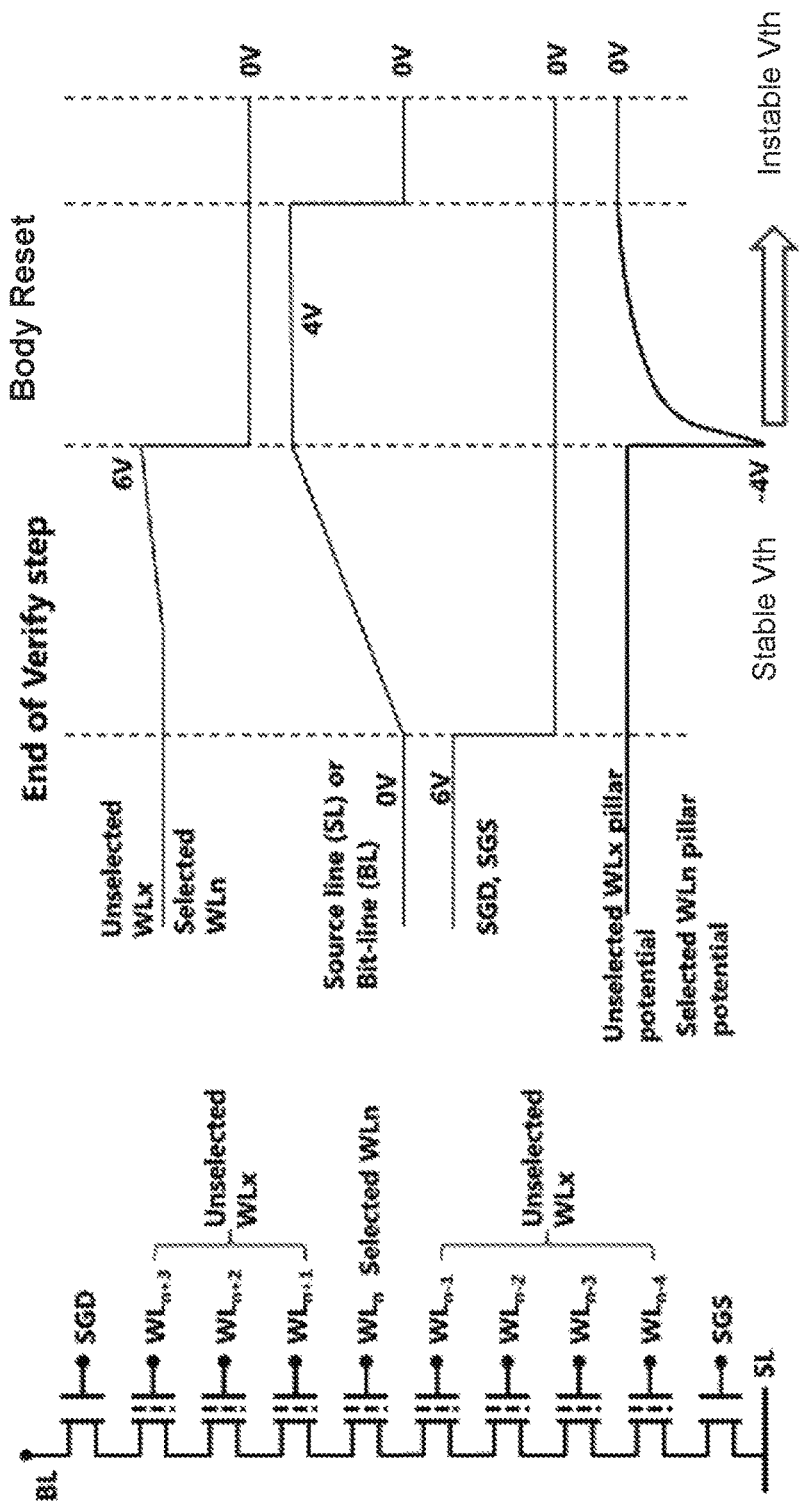
FIG. 1 illustrates a body reset scheme.

Reference will now be made to the exemplary embodiments illustrated, and specific language will be used herein to describe the same. It will nevertheless be understood that no limitation on invention scope is thereby intended.

DESCRIPTION OF EMBODIMENTS

Before the disclosed invention embodiments are described, it is to be understood that this disclosure is not limited to the particular structures, process steps, or materials disclosed herein, but is extended to equivalents thereof as would be recognized by those ordinarily skilled in the relevant arts. It should also be understood that terminology employed herein is used for the purpose of describing particular examples or embodiments only and is not intended to be limiting. The same reference numerals in different drawings represent the same element. Numbers provided in flow charts and processes are provided for clarity in illustrating steps and operations and do not necessarily indicate a particular order or sequence.

Furthermore, the described features, structures, or characteristics can be combined in any suitable manner in one or more embodiments. In the following description, numerous specific details are provided, such as examples of layouts, distances, network examples, etc., to provide a thorough understanding of various invention embodiments. One skilled in the relevant art will recognize, however, that such detailed embodiments do not limit the overall inventive concepts articulated herein, but are merely representative thereof.

As used in this written description, the singular forms "a," "an" and "the" include express support for plural referents unless the context clearly dictates otherwise. Thus, for example, reference to "a bit line" includes a plurality of such bit lines.

Reference throughout this written description to "an example" means that a particular feature, structure, or characteristic described in connection with the example is included in at least one embodiment of the present invention. Thus, appearances of the phrases "in an example" or "an embodiment" in various places throughout this specification are not necessarily all referring to the same embodiment.

As used herein, a plurality of items, structural elements, compositional elements, and/or materials can be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and examples can be referred to herein along with alternatives for the various components thereof. It is understood that such embodiments, examples, and alternatives are not to be construed as defacto equivalents of one another, but are to be considered as separate and autonomous representations under the present disclosure.

Furthermore, the described features, structures, or characteristics can be combined in any suitable manner in one or more embodiments. In the following description, numerous specific details are provided, such as examples of layouts, distances, network examples, etc., to provide a thorough understanding of invention embodiments. One skilled in the relevant art will recognize, however, that the technology can be practiced without one or more of the specific details, or with other methods, components, layouts, etc. In other instances, well-known structures, materials, or operations may not be shown or described in detail to avoid obscuring aspects of the disclosure.

In this disclosure, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the compositions nature or characteristics would be permissible if present under the "consisting essentially of" language, even though not expressly recited in a list of items following such terminology. When using an open ended term in this written description, like "comprising" or "including," it is understood that direct support should be afforded also to "consisting essentially of" language as well as "consisting of" language as if stated explicitly and vice versa.

The terms "first," "second," "third," "fourth," and the like in the description and in the claims, if any, are used for distinguishing between similar elements and not necessarily for describing a particular sequential or chronological order. It is to be understood that any terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

As used herein, comparative terms such as "increased," "decreased," "better," "worse," "higher," "lower," "enhanced," and the like refer to a property of a device, component, or activity that is measurably different from other devices, components, or activities in a surrounding or adjacent area, in a single device or in multiple comparable devices, in a group or class, in multiple groups or classes, or as compared to the known state of the art. For example, a data region that has an "increased" risk of corruption can refer to a region of a memory device which is more likely to have write errors to it than other regions in the same memory device. A number of factors can cause such increased risk, including location, fabrication process, number of program pulses applied to the region, etc.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint. However, it is to be understood that even when the term "about" is used in the present specification in connection with a specific numerical value, that support for the exact numerical value recited apart from the "about" terminology is also provided.

Numerical amounts and data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 1.5, 2, 2.3, 3, 3.8, 4, 4.6, 5, and 5.1 individually.

This same principle applies to ranges reciting only one numerical value as a minimum or a maximum. Furthermore, such an interpretation should apply regardless of the breadth of the range or the characteristics being described.

EXAMPLE EMBODIMENTS

An initial overview of technology embodiments is provided below and then specific embodiments are described in further detail later. This initial summary is intended to aid readers in understanding the technology more quickly, but is not intended to identify key or essential technological features nor is it intended to limit the scope of the claimed subject matter. Unless defined otherwise, all technical and scientific terms used herein have the same meaning as commonly understood by one of ordinary skill in the art to which this disclosure belongs.

In one example, a memory device can utilize non-volatile memory. Non-volatile memory is a storage medium that does not require power to maintain the state of data stored by the medium. Non-limiting examples of non-volatile memory can include any or a combination of solid state memory (such as planar or three-dimensional (3D) NAND flash memory, NOR flash memory, or the like), cross point array memory, including 3D cross point memory, phase change memory (PCM), such as chalcogenide PCM, non-volatile dual in-line memory module (NVDIMM), byte addressable nonvolatile memory, ferroelectric memory (Fe-RAM), silicon-oxide-nitride-oxide-silicon (SONOS) memory, polymer memory (e.g., ferroelectric polymer memory), ferroelectric transistor random access memory (Fe-TRAM), spin transfer torque (STT) memory, nanowire memory, electrically erasable programmable read-only memory (EEPROM), magnetic storage memory, magnetoresistive random-access memory (MRAM), write in place non-volatile MRAM (NVMRAM), nanotube RAM (NRAM), and the like. In some examples, non-volatile memory can comply with one or more standards promulgated by the Joint Electron Device Engineering Council (JEDEC), such as JESD218, JESD219, JESD220-1, JESD223B, JESD223-1, or other suitable standard (the JEDEC standards cited herein are available at www.jedec.org). In one specific example, the memory device can utilize 3D cross point memory.

In one example, the memory device can utilize non-volatile flash memory, which can include a memory array. The memory array can include a large number of memory cells arranged in a row and column fashion. The cells can be grouped into blocks. Each of the cells within a block can be electrically programmed by charging a floating gate. The charge can be removed from the floating gate by a block erase operation. Data can be stored in a cell as charge in the floating gate.

In one example, the memory device can utilize vertical memory, such as 3D memory. For example, a 3D flash memory (e.g., 3D NAND memory array) device can include a plurality of strings of charge storage devices (memory cells) stacked over one another, with each charge storage device corresponding to one of multiple tiers of the device. The charge storage devices of a respective string can share a common channel region, such as one formed in a respective pillar of semiconductor material (e.g., polysilicon) about which the string of charge storage devices can be formed.

In one example, each group of the plurality of strings can include a group of strings sharing a plurality of access lines, known as wordlines (WLs). Each of the plurality of access lines can couple (e.g., electrically or otherwise operably connect) the charge storage devices (memory cells) corresponding to a respective tier of the plurality of tiers of each string. The charge storage devices coupled by the same access line (and thus corresponding to the same tier) can be logically grouped into memory pages, when each charge storage device includes a cell capable of storing X bits of information, wherein X is a positive integer.

In one example, each group of the plurality of strings can include a group of strings coupled by a corresponding data lines, known as bitlines (BLs). A 3D memory may be divided into memory blocks, comprising a plurality of memory pages, selectable via drain-side select gate (hereinafter select gate drain (SGD)) devices and source-side select gate (select gate source (SGS)) devices that can be provided over each end of the pillars to control memory cells. A 3D NAND memory array can utilize floating body pillars with SGS and SGD at the edge.

In one example, a read operation of the 3D NAND memory array can include accessing data stored at a particular memory location of the memory array. Prior to a write (program) operation to a specific block of the memory array, the specific block can first be erased with the application of high voltages. In another example, a program operation can involve the careful application of high voltages to a selected memory location, followed by a program verify operation to ensure that the data has been properly programmed. Furthermore, since high voltages are used, the flash chip can be designed to be relatively tolerant to inadvertent programming of non-selected (e.g., deselected) memory cells. Generally, a memory cell can be programmed by applying a high voltage to its gate while keeping its source and drain terminals grounded.

In one example, a high electrical field can cause electrons in the memory cell channel to cross the gate oxide and embed in the floating gate (known as Fowler-Nordheim (F-N) tunneling), thereby increasing an effective threshold voltage of the memory cell. Programming can be typically done by the page or block, meaning that all the memory cells in the block connected to the same wordline can be selected to be programmed with write data (e.g., logic "0") at the same time. The remaining memory cells can be unselected (deselected) during programming. Since the memory cells start in the erased state (logic "1") prior to programming, only the memory cells to be programmed with the logic "0" can be subjected to the high electric fields necessary to promote F-N tunneling.

In one configuration, the memory device can include a 3D memory array. The memory device can include a defined number of wordlines that can carry corresponding signals (e.g., WL0, WL1, WL2, and WL3). The memory device can include a defined number of data lines (bitlines) that can carry corresponding signals (e.g., BL0, BL1, and BL2). The memory device can include a plurality of memory cells and a plurality of transistors. These memory cells and transistors can be arranged in memory cell strings (pillars), and these memory cell strings can be included in the memory array. The memory cells can be physically located in multiple levels of the memory device, such that memory cells in the same memory cell string can be stacked over each other in multiple levels of the memory device, thereby forming a pillar. The transistors can be controlled (e.g., turned on or turned off) by corresponding signals (e.g., SGD0, SGD1, SGD2, and SGD3, and SGS0, SGS1, SGS2, and SGS3) provided via corresponding wordlines to couple the memory cell strings to their respective bitlines, during a memory operation, such as a write operation. In the write operation, different voltages can be applied to the wordlines to selectively access the memory cells in order to store information into one or more selected memory cells. In one example, the memory array can include one or more memory blocks disposed in a die, such as a NAND die. In operation, such as when a memory array is to be accessed for programming (or data reading), a memory block can be selected (e.g., for programming) or deselected, in order to refrain from programming while other block(s) are being programmed. Accordingly, in a memory array having a plurality of memory blocks, at least one block can be selected for access (e.g., for a program mode or read mode), while other blocks can be deselected in order to refrain from access. Selection and deselection of memory blocks can be accomplished by application of particular voltage values to respective wordlines and SGS lines.

In the present technology, a memory device (e.g., a 3D NAND flash memory device) can include a plurality of memory cells, such as quad-level cells (QLCs) that support four bits per cell, and a memory controller. The memory device can implement a modified body reset operation (or body reset scheme). The body reset operation can function to stabilize a pillar potential (or channel voltage) for the plurality of memory cells. For example, the body reset operation can be performed to recover or change a pillar potential to a certain stable level in accordance with its purpose. In a more specific example, the body reset operation can involve biasing a certain level voltage from source or bitline to stabilize the pillar potential. The body reset operation can be an independent operation, such that the body reset operation can be incorporated before and/or after a program, read or verify operation. For example, the body reset operation can be performed before and/or after a program and verify operation, and the body reset operation can be performed before and/or after a read operation. As described in further detail below, a selective body reset operation can be utilized to concurrently improve program disturbance and threshold voltage instability in the memory device.

In one configuration, the memory controller in the memory device can apply a first voltage level to a selected wordline associated with the plurality of memory cells during the body reset operation. The memory controller can apply a second voltage level to an unselected wordline associated with the plurality of memory cells during the body reset operation. The first voltage level can be higher than the second voltage level. The memory controller can apply the first voltage and the second voltage to cause the selected wordline to transit to a stable negative pillar potential. By applying the first voltage and the second voltage (that is lower than the first voltage) in the body reset operation to create the stable negative pillar potential for the selected wordline, the pillar potential for the selected wordline is stabilized. The stable negative pillar potential can cause selected memory cells associated with the selected wordline to have a reduced threshold voltage instability. In other words, the stable negative pillar potential can cause the selected memory cells associated with the selected wordline to have a more stable threshold voltage.

In one configuration, the memory controller in the memory device can apply the second voltage level to the unselected wordline during the body reset operation to cause the unselected wordline to have a negative pillar potential. The negative pillar potential for the unselected wordline can transit to an increased pillar potential over a period of time. In one example, the negative pillar potential for the unselected wordline can transit to a zero pillar potential over the period of time, or alternatively, the negative pillar potential for the unselected wordline can transmit to a given pillar potential that is greater than the negative pillar potential. In addition, the stable negative pillar potential can mitigate a cell state-width degradation in the memory device.

In one configuration, by controlling the selected wordline and the unselected wordlines separately at a program/verify operation during the body reset operation, the cell state-width degradation can be resolved with keeping an impact on program disturbance. For example, the selected wordline and the unselected wordline can be controlled separately during the body reset operation to mitigate a hot electron program disturbance. A higher gate voltage can be applied or induced at the selected wordline as compared to the unselected wordlines when holes begin to be injected from source or bitlines by gate-induced drain leakage (GIDL), such that the holes are injected selectively except for a corresponding channel to the selected wordline. In other words, the selective hole injection can occur when the holes begin to be injected from the source or bitlines associated with the plurality of memory cells by GIDL, thereby causing the holes to be selectively injected except in the channel corresponding to the selected wordline. As a result, the selected wordline can maintain a more stable threshold voltage (or a lower transient threshold voltage), for example, at a verify operation. The more stable threshold voltage can be comparable to a state of cell threshold voltages at actual read operations. Based on the threshold voltage states between verify and read operations and no hole accumulation at the selected wordline, a negative pillar potential is achieved during the body reset operation, and this resolves the cell state-width degradation in the memory device. In other words, when the selective hole injection does not involve the selected wordline, a resulting negative pillar potential can be achieved for the selected wordline during the body reset operation, which can mitigate the state-width degradation in the memory device. In addition, the selective hole injection can cause a negative pillar potential for the unselected wordline, and the negative pillar potential for the unselected wordline can transit from the negative pillar potential to an increased pillar potential (e.g., a zero pillar potential) over a period of time.

In one example, the holes can be injected to a channel corresponding to source-side memory cells in the plurality of memory cells, which leads to recovering to a neutral pillar potential (or neutral channel potential) at the source-side memory cells, and the neutral pillar potential before a program inhibit operation can mitigate the hot electron program disturbance. In other words, hole injection can occur at the source-side memory cells, which can result in the neutral pillar potential prior to the program inhibit operation for mitigating the program disturbance. In the program inhibit operation, to stop programming at a program-inhibited cell which share the wordline with selected cells, its corresponding channel can become increased to compensate a program voltage biased at the cell's wordline. A channel potential's gradient between a selected channel and an unselected channel can become reduced during the program inhibit operation and thereby, the hot electron program disturbance can be mitigated.

In past solutions, the body reset scheme for 3D NAND flash memory involved initializing a pillar potential that became negative at an end of a read/verify operation. As a cell gate-biasing dropped to a zero voltage at the end of the read/verify operation, the pillar potential would transit to approximately $-4$ volts (V) due to no supply of holes, which is a unique feature of the floating-body structure of the 3D NAND memory. The resulting negative pillar potential (or channel voltage) would make a boosting level of its channel potential lower at a program-inhibit channel at a next program operation, which would lead to degradation in program disturbance. In past solutions, although the body reset scheme would be applied immediately after the verify operation, which would recover the negative pillar potential to approximately 0V, this would result in an unstable threshold voltage. In other words, the past solutions would cause a cell threshold voltage to be at a higher stable state. In addition, while the past solutions would improve the program disturbance, one disadvantage of the past solutions was the cell state-width degradation of program cells in the 3D NAND flash memory device.

In the past solutions, the 3D NAND flash memory did not provide any consideration and implementation of cell state-width degradation (or cell state-width widening). In the past solutions, all wordlines were biased to 0V such that channel neutralization was maximized and program disturbance was improved, but the real application of the past solutions were limited due to the cell state-width widening of the program cells in the 3D NAND flash memory.

In the present technology, the selected wordline and the unselected wordlines can be controlled separately at a program/verify operation during the body reset operation (e.g., a voltage level applied to the selected wordline can be greater than a voltage level applied to the unselected wordline), cell state-width degradation can be resolved. In other words, the selectively positive biasing to the wordline that wishes to keep the more stable threshold voltage (or lower transient threshold voltage) results in a tighter cell-state width being applied. This technique for performing the body reset operation can be useful for QLC technology with window expansion because hot electron program disturbance can be mitigated without losing cell state-width. The window expansion can indicate the range of the memory cell's threshold voltage to place memory states, and a greater number of memory states can require a larger range for the cell's threshold voltage.

FIG. 1 illustrates an example of a body reset scheme. The body reset scheme can be applied to a plurality of memory cells in a memory device (not shown). In this example, the memory device can include a bitline (BL), a source line (SL), a select gate drain (SGD), a select gate source (SGS), a selected wordline (WLn) (e.g., $WL_n$), and a plurality of unselected wordlines (WLx) (e.g., $WL_{n+1}$ to $W_{Ln+3}$ and $W_{Ln-1}$ to $W_{Ln-4}$). In this example, the selected wordline can be surrounded by the unselected wordlines.

In one example, a same voltage can be applied to the unselected wordlines and the selected wordline. For example, as shown, approximately 6V can be applied until an end of a read/verify operation, and then the voltage can drop to approximately 0V at a hole injection phase. As shown, the SL or BL can transit from approximately 0V to approximately 4V at the end of the read/verify operation, and then can be maintained at the approximately 4V during the hole injection phase before dropping back to the approximately 0V. As shown, the SGD and the SGS can transit from approximately 6V to approximately 0 volts. An unselected wordline pillar potential and a selected wordline pillar potential can be at a defined level and then becomes a negative value at the end of the read/verify operation. For example, the unselected wordline pillar potential and the selected wordline pillar potential can be approximately −4V at the end of the read/verify operation. At this point, a stable threshold voltage (or a lower transient threshold voltage) can be achieved. During the hole injection, the unselected wordline pillar potential and the selected wordline pillar potential can transit up to approximately 0V, which causes an unstable threshold voltage (or high stable threshold voltage), which is undesirable for the memory device. In other words, even though the negative channel can recover to approximately 4V, this results in the unstable threshold voltage. In addition, even though program disturbance is improved for hot electron mitigation, this previously-known body reset scheme imposes a cell state-width degradation of the memory cells. In other words, this previously-known body reset scheme imposes a cell state-width widening, as well as a lower threshold voltage as compared to a program verify level.

Figure 2:
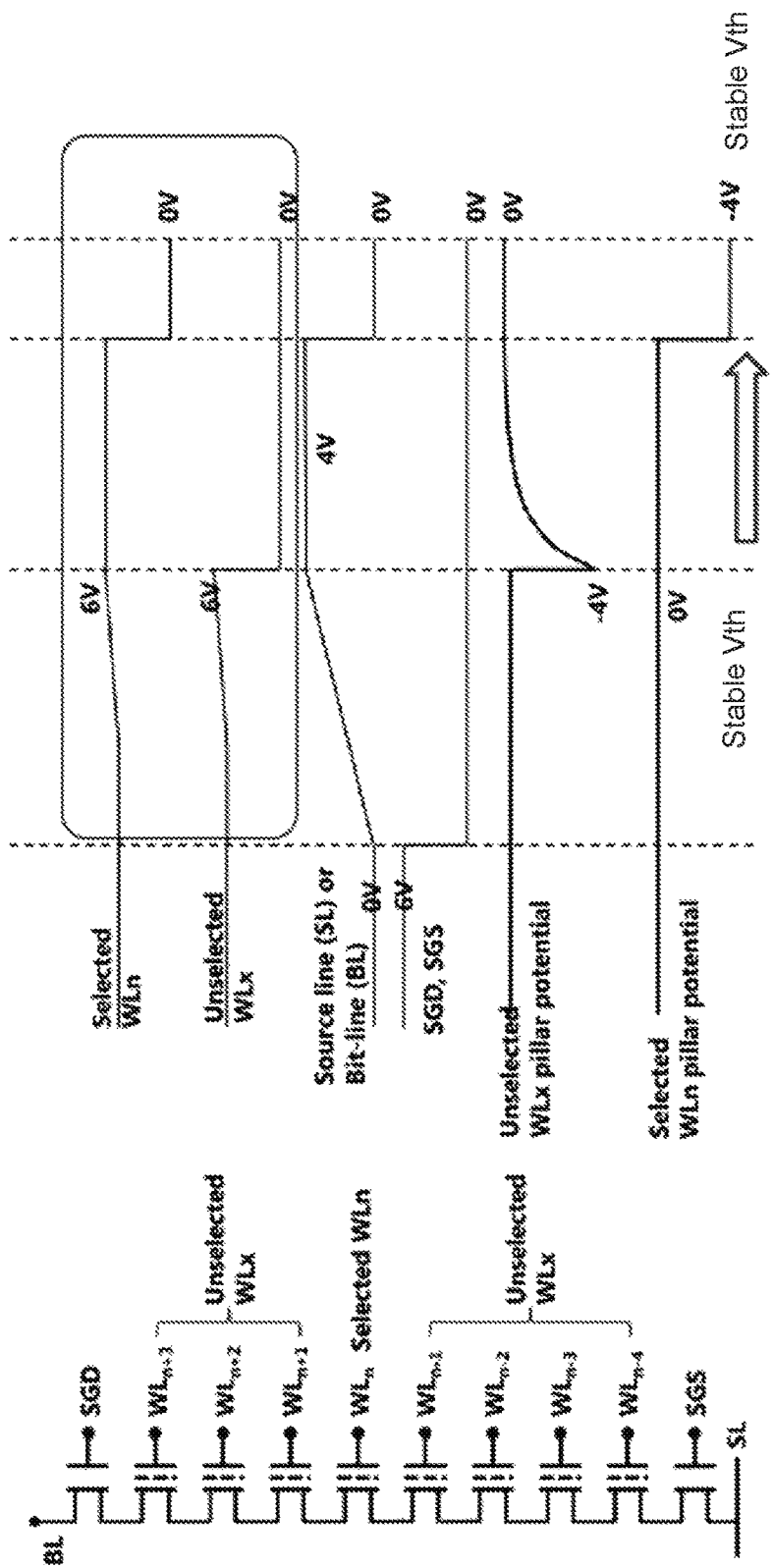
FIG. 2 illustrates a body reset scheme in accordance with an example embodiment.

FIG. 2 illustrates an example of a body reset scheme. The body reset scheme can be applied to a plurality of memory cells in a memory device (not shown). In this example, the memory device can include a bitline (BL), a source line (SL), a select gate drain (SGD), a select gate source (SGS), a selected wordline (WLn) (e.g., $WL_n$), and a plurality of unselected wordlines (WLx) (e.g., $WL_{n+1}$ to $W_{Ln+3}$ and $W_{Ln-1}$ to $W_{Ln-4}$). In this example, the selected wordline can be surrounded by the unselected wordlines.

In one example, different voltages can be applied to the unselected wordlines and the selected wordline. For example, as shown, approximately 6V can be applied to the selected wordline during a read/verify operation and a hole injection phase, and then the voltage can drop to approximately 0V. For the unselected wordline, approximately 6V can be applied until an end of the read/verify operation, and then the voltage can drop to approximately 0V at a hole injection phase. Thus, the voltage applied to the selected wordline can be greater than the voltage applied to the unselected wordline. Since the voltages can be selectively applied to the selected wordline and the unselected wordline, the novel body reset scheme can involve using a selective body reset operation. As shown, the SL or BL can transit from approximately 0V to approximately 4V at the end of the read/verify operation, and then can be maintained at the approximately 4V during the hole injection phase before dropping back to the approximately 0V. As shown, the SGD and the SGS can transit from approximately 6V to approximately 0 volts. An unselected wordline pillar potential can be at a defined level and then becomes a negative value at the end of the read/verify operation. For example, the unselected wordline pillar potential can be approximately −4V at the end of the read/verify operation, and the unselected wordline pillar potential can transit from approximately −4V to approximately 0V during the hole injection phase. On the other hand, the selected wordline pillar potential can be maintained at approximately 0V until the end of the read/verify operation, and then the approximately 0V can be maintained during the hole injection phase before eventually dropping to −4V. The selected wordline pillar potential of approximately 0V can result in a stable threshold voltage (or a lower transient threshold voltage), and this stable threshold voltage can be still achieved when the selected wordline pillar potential transits to the approximately 0V. In this novel body reset scheme, the stable threshold voltage can be continuously achieved for the selected wordline, in part because of the separate voltages applied to the selected wordline and the unselected wordline. In addition, program disturbance can be improved for hot electron mitigation, and a tighter cell state-width can be imposed for the memory cells (i.e., there is no cell state-width widening or degradation). In other words, this novel body reset scheme results in a tighter cell state-width, as well as a same threshold voltage as compared to a program verify level.

In the body reset scheme, as shown, the selected wordline and the unselected wordlines can be controlled separately, such that the cell state-width degradation can be resolved with keeping an impact on program disturbance. The higher gate voltage can be applied or induced at the selected wordline as compared to the unselected wordlines when holes begin to be injected from source or bitlines by gate-induced drain leakage (GIDL), such that the holes are injected selectively except for a corresponding channel to the selected wordline. In other words, the selective hole injection can occur when the holes begin to be injected from the source or bitlines associated with the plurality of memory cells by GIDL, thereby causing the holes to be selectively injected except in the channel corresponding to the selected wordline. As a result, the selected wordline can maintain the more stable threshold voltage (or the lower transient threshold voltage). The more stable threshold voltage can be comparable to a state of cell threshold voltages at actual read operations. Based on the threshold voltage states between verify and read operations and no hole accumulation at the selected wordline, the negative pillar potential can be achieved for the selected wordline during the novel body reset scheme, and this resolves the cell state-width degradation in the memory device. In other words, when the selective hole injection does not involve the selected wordline, the resulting negative pillar potential can be achieved for the selected wordline during the novel body reset scheme, which can mitigate the state-width degradation in the memory device.

Figure 3A:
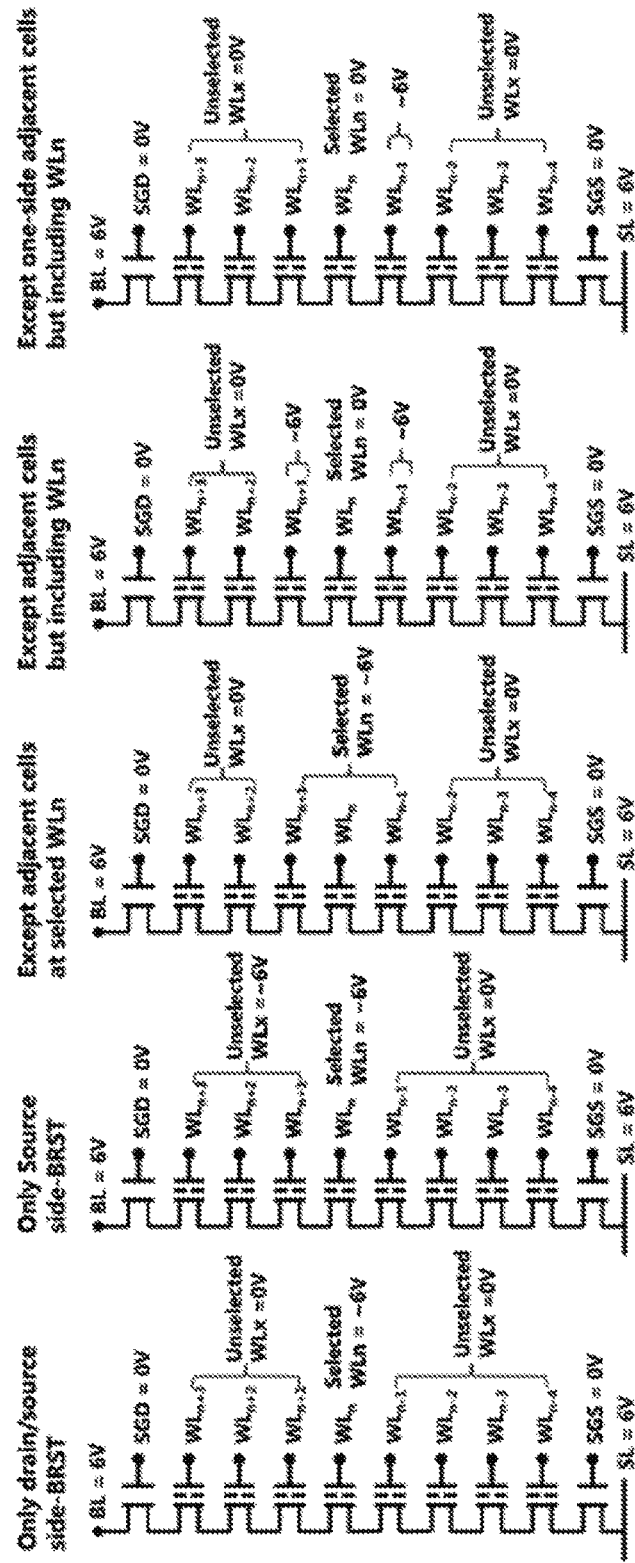
FIG. 3A illustrates a body reset scheme in accordance with an example embodiment.

FIG. 3A illustrates an example of another body reset scheme. The body reset scheme can cause a selected wordline in a memory device to have a negative pillar potential (or negative channel voltage), thereby sustaining a more stable threshold voltage. In one example, the body reset scheme can include various options for achieving the negative pillar potential. In a first example, as shown, an only drain/source side body reset scheme can be utilized, in which the unselected wordlines can be 0V and the selected wordline can be −6V. In a second example, as shown, an only source side body reset scheme can be utilized, in which first unselected wordlines are −6V, second unselected wordlines are 0V and the selected wordline is −6V. In a third example, as shown, a body reset scheme except adjacent cells at selected wordline can be utilized, in which the unselected wordlines can be 0V and the selected wordline can be −6V. In a fourth example, as shown, a body reset scheme except adjacent cells but including the selected wordline can be utilized, in which the selected wordline is 0V or −6V, and the unselected wordlines are 0V. In a fifth example, as shown, a body reset scheme except one-side adjacent cells but including the selected wordline can be utilized, in which the selected wordline is 0V or −6V, and the unselected wordlines are 0V. In addition, in each of the five examples described above, the BL can be 6V, the SGD can be 0V, the SGS can be 0V and the SL can be 6V.

Figure 3B:
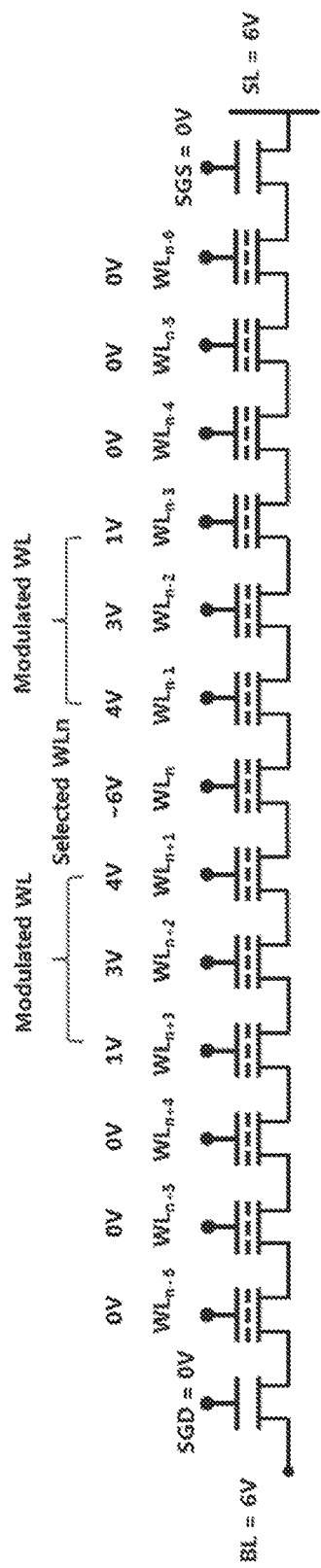
FIG. 3B illustrates a body reset scheme in accordance with an example embodiment.

FIG. 3B illustrates an example of a novel body reset scheme that utilizes a gradual modulation of a pass voltage. In this scheme, at least two adjacent wordlines can be gradually decreased toward a bitline or source line. For example, the modulated wordline can decrease from 4V to 3V to 1V to 0 V. In this example, the selected wordline can be set to 0V or a selected positive voltage. The modulated wordlines can be placed at a drain-side or source-side. In addition, in this example, the BL can be 6V, the SGD can be 0V, the SGS can be 0V and the SL can be 6V.

Figures 4A, 4B:
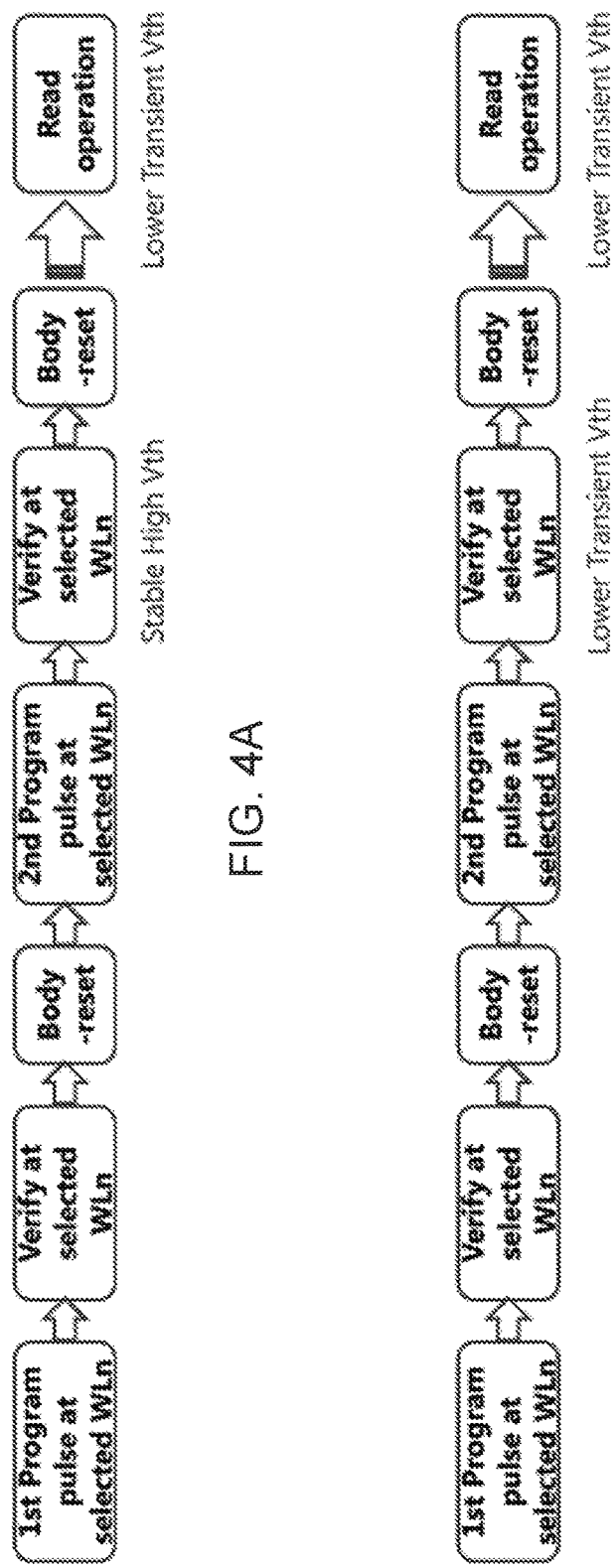
FIG. 4A illustrates a series of operations in a memory device.
FIG. 4B illustrates a series of operations in a memory device in accordance with an example embodiment.

FIG. 4A illustrates an example of a series of previously known operations in a memory device (not shown). In a first step, a first program pulse can be performed at a selected wordline at the memory device. In a second step, a verify operation can be performed at the selected wordline at the memory device. In a third step, a body reset operation can be performed at the memory device. In a fourth step, a second program pulse can be performed at the selected wordline at the memory device. In a fifth step, a verify operation can be performed at the selected wordline at the memory device. At this point, at the end of the verify operation, the selected wordline can be associated with an unstable threshold voltage (or stable high threshold voltage). In other words, the memory device can experience threshold voltage instability at the end of the verify operation. In a sixth step, a body reset operation can be performed at the memory device. In a seventh step, a read operation can be performed at the memory device. At this point, the selected wordline can be associated with a more stable threshold voltage (or lower transient threshold voltage). In this solution, even though program disturbance is improved for hot electron mitigation, a cell state-width degradation or widening can be imposed, as well as a lower threshold voltage as compared to a program verify level.

FIG. 4B illustrates an example of a series of novel operations in a memory device (not shown). In a first step, a first program pulse can be performed at a selected wordline at the memory device. In a second step, a verify operation can be performed at the selected wordline at the memory device. In a third step, a selective body reset operation can be performed at the memory device. In a fourth step, a second program pulse can be performed at the selected wordline at the memory device. In a fifth step, a verify operation can be performed at the selected wordline at the memory device. At this point, at the end of the verify operation, the selected wordline can be associated with a stable threshold voltage (or lower transient threshold voltage). Due to the selective body reset operation, the memory device does not experience threshold voltage instability at the end of the verify operation. In a sixth step, a selective body reset operation can be performed at the memory device. In a seventh step, a read operation can be performed at the memory device. At this point, the selected wordline can still be associated with the stable threshold voltage (or lower transient threshold voltage). In this solution, program disturbance is improved for hot electron mitigation, and a tighter cell state-width can be imposed (i.e., there is no cell state-width degradation or widening), as well as a same threshold voltage as compared to a program verify level.

Figure 5:
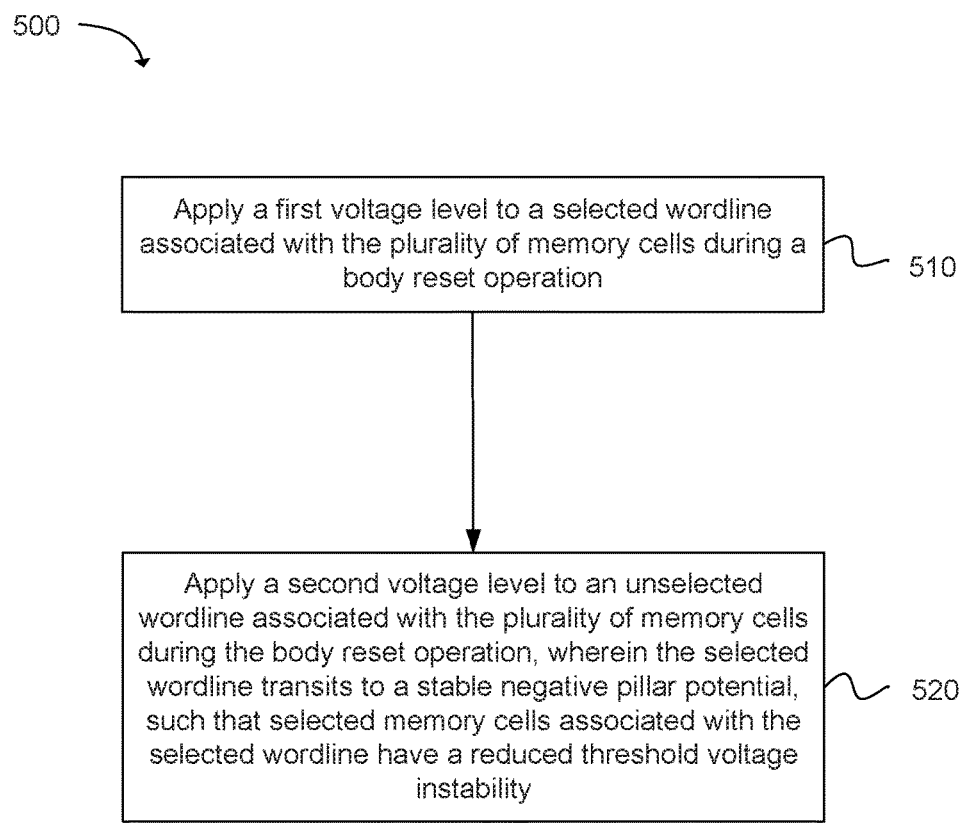
FIG. 5 illustrates functionality of a memory device operable to program memory cells in the memory device in accordance with an example embodiment.

FIG. 5 illustrates an exemplary functionality of a memory device operable to program memory cells in the memory device. The memory device can include a plurality of memory cells and a memory controller. The memory device can include logic to apply a first voltage level to a selected wordline associated with the plurality of memory cells during a body reset operation, as in block 510. The memory device can include logic to apply a second voltage level to an unselected wordline associated with the plurality of memory cells during the body reset operation, wherein the selected wordline transits to a stable negative pillar potential, such that selected memory cells associated with the selected wordline have a reduced threshold voltage instability, as in block 520.

Figure 6:
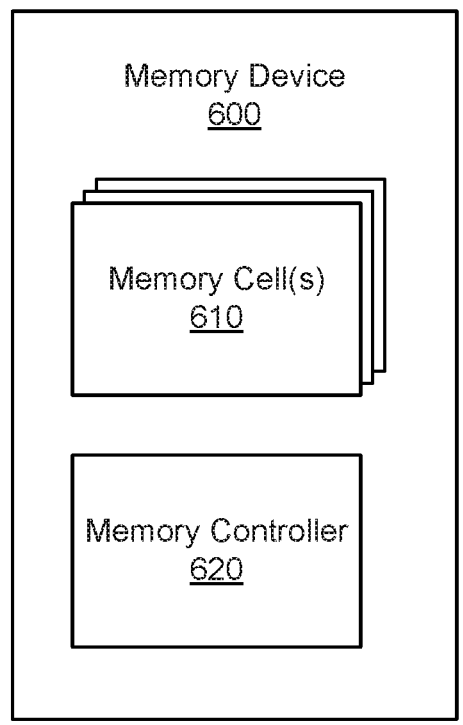
FIG. 6 illustrates a memory device in accordance with an example embodiment.

FIG. 6 illustrates an exemplary memory device 600. The memory device 600 can be a three-dimensional (3D) NAND flash memory device operable. The memory device 600 can include a plurality of memory cells 610. The memory device 600 can include a memory controller 620. The memory controller 620 can apply a first voltage level to a selected wordline associated with the plurality of memory cells 610 during a body reset operation. The body reset operation can function to stabilize a pillar potential for the selected wordline. The memory controller 620 can apply a second voltage level to an unselected wordline associated with the plurality of memory cells 610 during the body reset operation. The first voltage level can be higher than the second voltage level. The first voltage level and the second voltage level can be applied during the body reset operation to cause the selected wordline to transit to a stable negative pillar potential, such that selected memory cells associated with the selected wordline can have a more stable threshold voltage.

Figure 7:
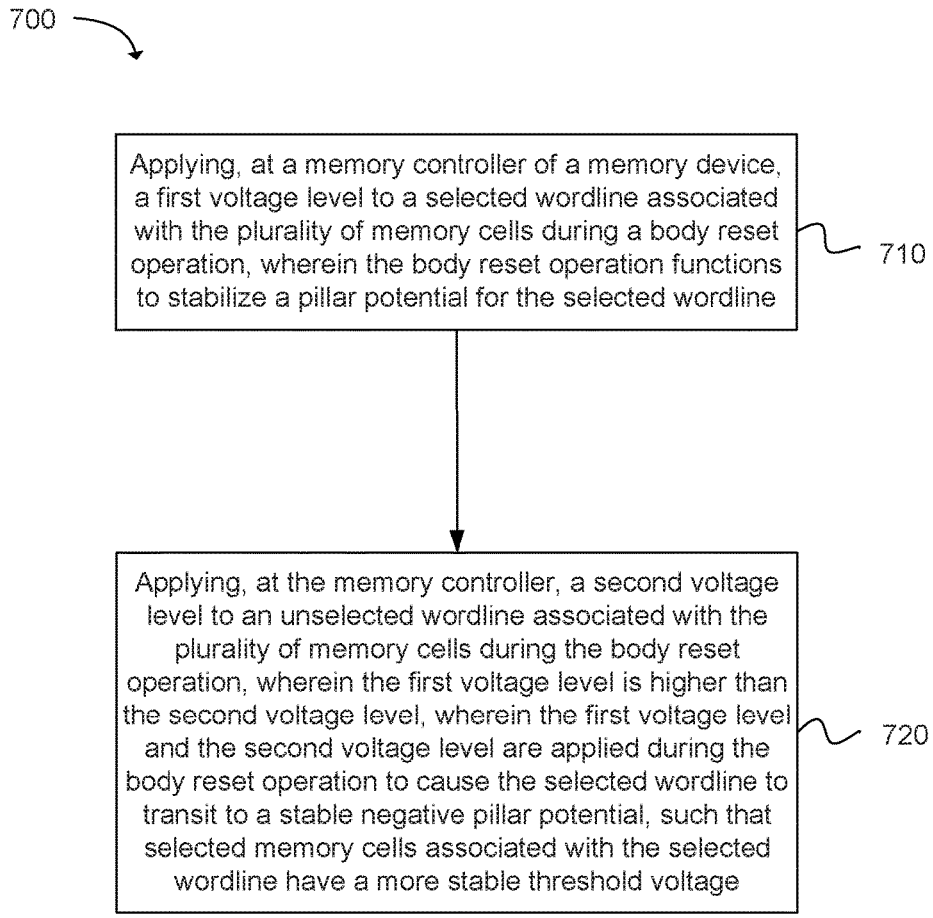
FIG. 7 depicts a flowchart of a method for programming memory cells in a memory device in accordance with an example embodiment.

FIG. 7 depicts a flowchart of an exemplary method for programming memory cells in a memory device. The method can be executed as instructions on a machine, where the instructions are included on at least one computer readable medium or one non-transitory machine readable storage medium. The method can include the operation of: applying, at a memory controller of a memory device, a first voltage level to a selected wordline associated with the plurality of memory cells during a body reset operation, wherein the body reset operation functions to stabilize a pillar potential for the selected wordline, as in block 710. The method can include the operation of: applying, at the memory controller, a second voltage level to an unselected wordline associated with the plurality of memory cells during the body reset operation, wherein the first voltage level is higher than the second voltage level, wherein the first voltage level and the second voltage level are applied during the body reset operation to cause the selected wordline to transit to a stable negative pillar potential, such that selected memory cells associated with the selected wordline have a more stable threshold voltage, as in block 720.

Figure 8:
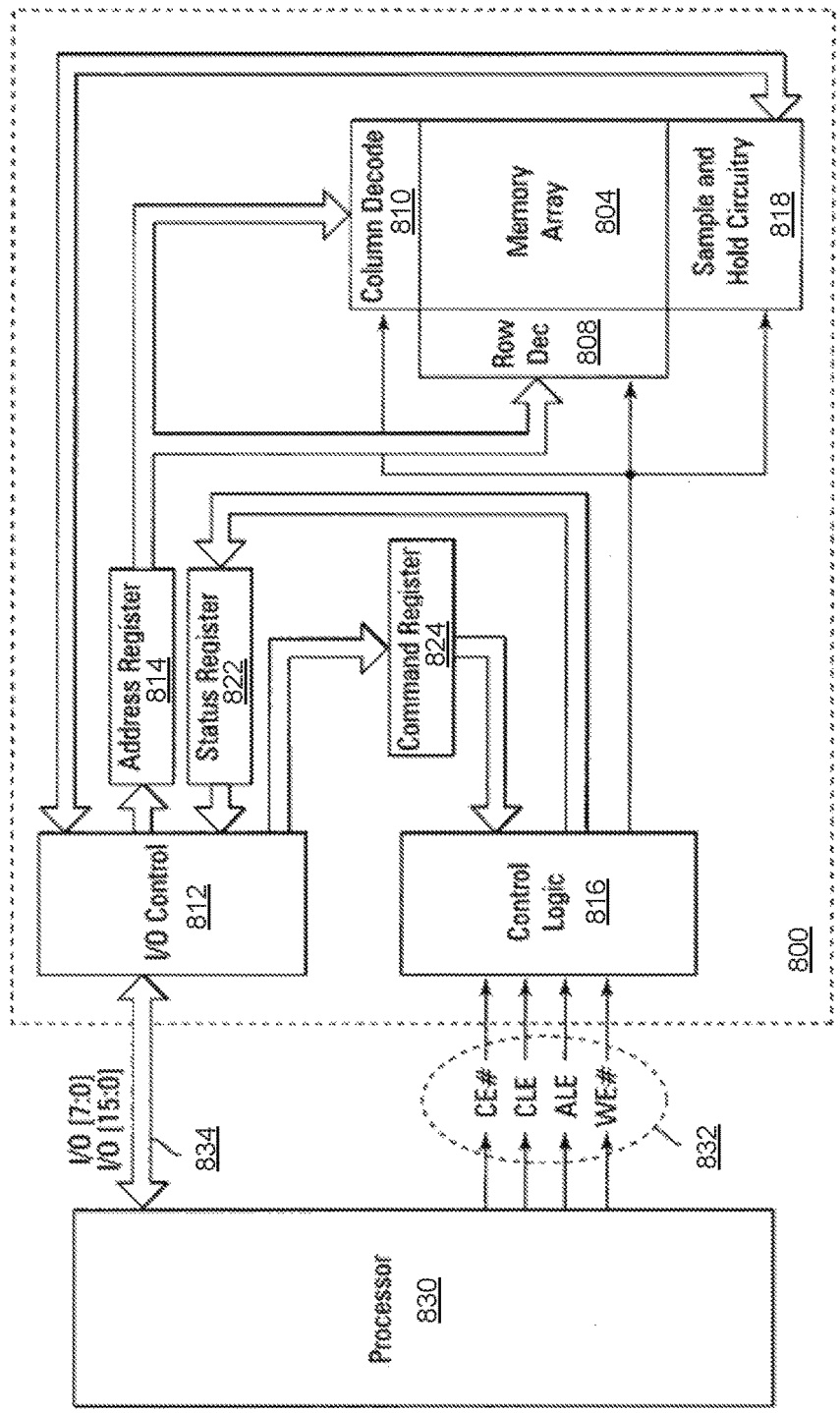
FIG. 8 illustrates a memory system diagram in accordance with an example embodiment.

FIG. 8 is a simplified block diagram of a memory device 800 according to an invention embodiment, and on which various methods can be practiced. In one example, the memory device 800 includes an array of memory cells 804 arranged in rows and columns. In another example, the memory device 800 can include a 3D array of memory cells 804 having stacked planes of memory cells, which can be arranged in rows and columns. Although the various embodiments will be described primarily with reference to NAND memory arrays, the various embodiments are not limited to a specific architecture of the memory array 804. Some examples of other array architectures suitable for the present embodiments include NOR arrays, AND arrays, and virtual ground arrays. In general, however, the embodiments described herein are adaptable to any array architecture permitting generation of a data signal indicative of the threshold voltage of each memory cell.

A row decode circuitry 808 and a column decode circuitry 810 are provided to decode address signals provided to the memory device 800. Address signals are received and decoded to access memory array 804. Memory device 800 also includes input/output (I/O) control circuitry 812 to manage input of commands, addresses and data to the memory device 800 as well as output of data and status information from the memory device 800. An address register 814 is coupled between I/O control circuitry 812 and row decode circuitry 808 and column decode circuitry 810 to latch the address signals prior to decoding. A command register 824 is coupled between I/O control circuitry 812 and control logic 816 to latch incoming commands. Control logic 816 controls access to the memory array 804 in response to the commands and generates status information for an external processor 830 (also known as a memory controller as described earlier). The control logic 816 is coupled to row decode circuitry 808 and column decode circuitry 810 to control the row decode circuitry 808 and column decode circuitry 810 in response to the addresses.

Control logic 816 can be coupled to a sample and hold circuitry 818. The sample and hold circuitry 818 latches data, either incoming or outgoing, in the form of analog data signals. For example, the sample and hold circuitry could contain capacitors or other analog storage devices for sampling either an incoming data signal representing data to be written to a memory cell or an outgoing data signal indicative of the threshold voltage sensed from a memory cell. The sample and hold circuitry 818 can further provide for amplification and/or buffering of the sampled signal to provide a stronger data signal to an external device.

The handling of analog data signals can take an approach where charge levels generated are stored on capacitors. A charge can be stored on a capacitor in response to subjecting it to a data signal indicative of an actual or target threshold voltage of a memory cell for reading or programming, respectively, the memory cell. This charge could then be converted to an analog data signal using a differential amplifier having a grounded input or other reference signal as a second input. The output of the differential amplifier could then be passed to the I/O control circuitry 812 for output from the memory device, in the case of a read operation, or used for comparison during one or more verify operations in programming the memory device. It is noted that the I/O control circuitry 812 could optionally include analog-to-digital conversion functionality and digital-to-analog conversion (DAC) functionality to convert read data from an analog data signal to a digital bit pattern and to convert write data from a digital bit pattern to an analog signal such that the memory device 800 could be adapted for communication with either an analog or digital data interface.

During a programming operation, target memory cells of the memory array 804 are programmed until voltages indicative of their Vt levels match the levels held in the sample and hold circuitry 818. This can be accomplished, as one example, using differential sensing devices to compare the held voltage level to a threshold voltage of the target memory cell. Much like traditional memory programming, programming pulses could be applied to a target memory cell to increase its threshold voltage until reaching or exceeding the desired value. In a read operation, the Vt levels of the target memory cells are passed to the sample and hold circuitry 818 for transfer to an external processor (not shown in FIG. 8) either directly as analog signals or as digitized representations of the analog signals depending upon whether ADC/DAC functionality is provided external to, or within, the memory device.

Threshold voltages of cells can be determined in a variety of manners. For example, an access line, such as those typically referred to as word lines, voltage could be sampled at the point when the target memory cell becomes activated. Alternatively, a boosted voltage could be applied to a first source/drain side of a target memory cell, and the threshold voltage could be taken as a difference between its control gate voltage and the voltage at its other source/drain side. By coupling the voltage to a capacitor, charge would be shared with the capacitor to store the sampled voltage. Note that the sampled voltage need not be equal to the threshold voltage, but merely indicative of that voltage. For example, in the case of applying a boosted voltage to a first source/drain side of the memory cell and a known voltage to its control gate, the voltage developed at the second source/drain side of the memory cell could be taken as the data signal as the developed voltage is indicative of the threshold voltage of the memory cell.

Sample and hold circuitry 818 can include caching, i.e., multiple storage locations for each data value, such that the memory device 800 can be reading a next data value while passing a first data value to the external processor, or receiving a next data value while writing a first data value to the memory array 804. A status register 822 is coupled between I/O control circuitry 812 and control logic 816 to latch the status information for output to the external processor.

Memory device 800 receives control signals at control logic 816 over a control link 832. The control signals can include a chip enable CE#, a command latch enable CLE, an address latch enable ALE, and a write enable WE#. Memory device 800 can receive commands (in the form of command signals), addresses (in the form of address signals), and data (in the form of data signals) from an external processor over a multiplexed input/output (I/O) bus 834 and output data to the external processor over I/O bus 834.

In a specific example, commands are received over input/output (I/O) pins [7:0] of I/O bus 834 at I/O control circuitry 812 and are written into command register 824. The addresses are received over input/output (I/O) pins [7:0] of bus 834 at I/O control circuitry 812 and are written into address register 814. The data can be received over input/output (I/O) pins [7:0] for a device capable of receiving eight parallel signals, or input/output (I/O) pins [15:0] for a device capable of receiving sixteen parallel signals, at I/O control circuitry 812 and are transferred to sample and hold circuitry 818. Data also can be output over input/output (I/O) pins [7:0] for a device capable of transmitting eight parallel signals or input/output (I/O) pins [15:0] for a device capable of transmitting sixteen parallel signals. It will be appreciated by those skilled in the art that additional circuitry and signals can be provided, and that the memory device of FIG. 8 has been simplified to help focus on the embodiments of the disclosure.

While FIG. 8 has been described with respect to sample and hold circuitry 818, it should be understood that the control logic 816 could be coupled to data latches instead of sample and hold circuitry 818 without departing from the scope of the disclosure. Data latches latch data, either incoming or outgoing. During a write operation, target memory cells of the memory array 804 are programmed, for example using two sets of programming pulses as described above, until voltages indicative of their Vt levels match the data held in the data latches. This can be accomplished, as one example, using differential sensing devices to compare the held data to a threshold voltage of the target memory cell.

Additionally, while the memory device of FIG. 8 has been described in accordance with popular conventions for receipt and output of the various signals, it is noted that the various embodiments are not limited by the specific signals and I/O configurations described. For example, command and address signals could be received at inputs separate from those receiving the data signals, or data signals could be transmitted serially over a single I/O line of I/O bus 834. Because the data signals represent bit patterns instead of individual bits, serial communication of an 8-bit data signal could be as efficient as parallel communication of eight signals representing individual bits.

Figure 9:
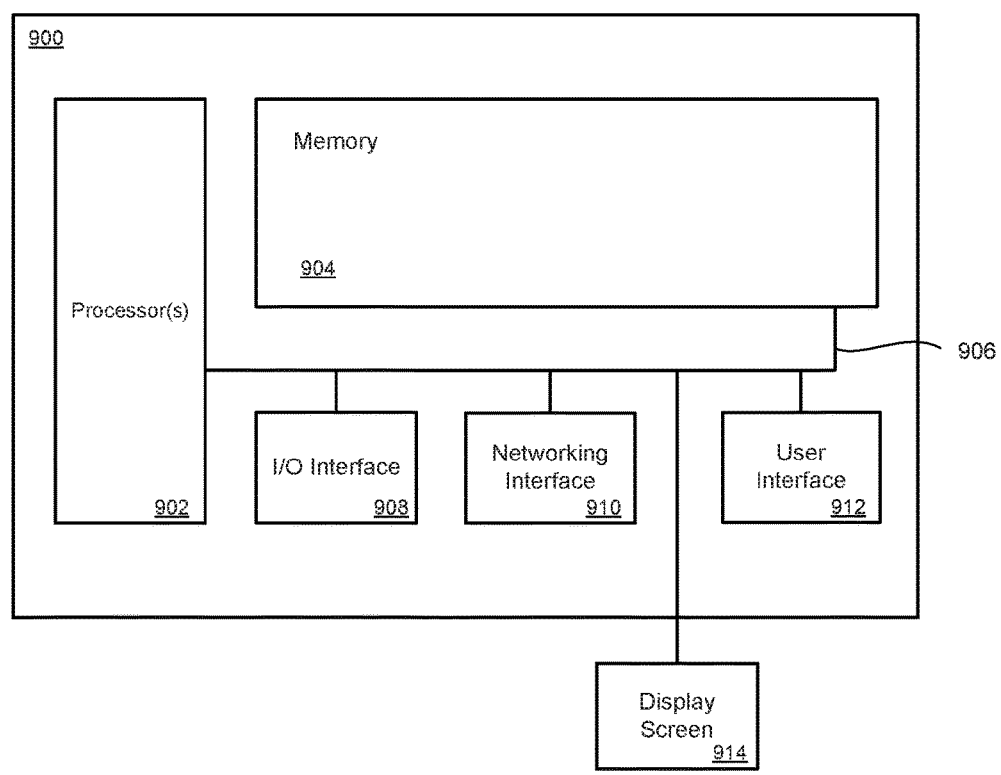
FIG. 9 illustrates a computing system that includes a data storage device in accordance with an example embodiment.

FIG. 9 illustrates a general computing system or device 900 that can be employed in the present technology. The computing system 900 can include a processor 902 in communication with a memory 904. The memory 904 can include any device, combination of devices, circuitry, and the like that is capable of storing, accessing, organizing and/or retrieving data. Non-limiting examples include SANs (Storage Area Network), cloud storage networks, volatile or non-volatile RAM, phase change memory, optical media, hard-drive type media, and the like, including combinations thereof.

The computing system or device 900 additionally includes a local communication interface 906 for connectivity between the various components of the system. For example, the local communication interface 906 can be a local data bus and/or any related address or control busses as may be desired.

The computing system or device 900 can also include an I/O (input/output) interface 908 for controlling the I/O functions of the system, as well as for I/O connectivity to devices outside of the computing system 900. A network interface 910 can also be included for network connectivity. The network interface 910 can control network communications both within the system and outside of the system. The network interface can include a wired interface, a wireless interface, a Bluetooth interface, optical interface, and the like, including appropriate combinations thereof. Furthermore, the computing system 900 can additionally include a user interface 912, a display device 914, as well as various other components that would be beneficial for such a system.

The processor 902 can be a single or multiple processors, and the memory 904 can be a single or multiple memories. The local communication interface 906 can be used as a pathway to facilitate communication between any of a single processor, multiple processors, a single memory, multiple memories, the various interfaces, and the like, in any useful combination.

Various techniques, or certain aspects or portions thereof, can take the form of program code (i.e., instructions) embodied in tangible media, such as floppy diskettes, CD-ROMs, hard drives, non-transitory computer readable storage medium, or any other machine-readable storage medium wherein, when the program code is loaded into and executed by a machine, such as a computer, the machine becomes an apparatus for practicing the various techniques. Circuitry can include hardware, firmware, program code, executable code, computer instructions, and/or software. A non-transitory computer readable storage medium can be a computer readable storage medium that does not include signal. In the case of program code execution on programmable computers, the computing device can include a processor, a storage medium readable by the processor (including volatile and non-volatile memory and/or storage elements), at least one input device, and at least one output device. The volatile and non-volatile memory and/or storage elements can be a RAM, EPROM, flash drive, optical drive, magnetic hard drive, solid state drive, or other medium for storing electronic data. The node and wireless device can also include a transceiver module, a counter module, a processing module, and/or a clock module or timer module. One or more programs that can implement or utilize the various techniques described herein can use an application programming interface (API), reusable controls, and the like. Such programs can be implemented in a high level procedural or object oriented programming language to communicate with a computer system. However, the program(s) can be implemented in assembly or machine language, if desired. In any case, the language can be a compiled or interpreted language, and combined with hardware implementations. Exemplary systems or devices can include without limitation, laptop computers, tablet computers, desktop computers, smart phones, computer terminals and servers, storage databases, and other electronics which utilize circuitry and programmable memory, such as household appliances, smart televisions, digital video disc (DVD) players, heating, ventilating, and air conditioning (HVAC) controllers, light switches, and the like.

EXAMPLES

The following examples pertain to specific invention embodiments and point out specific features, elements, or steps that can be used or otherwise combined in achieving such embodiments.

In one example, there is provided a system operable to program memory cells. The system can comprise a plurality of memory cells. The system can comprise a memory controller. The memory controller can comprise logic to apply a first voltage level to a selected wordline associated with the plurality of memory cells during a body reset operation. The memory controller can comprise logic to apply a second voltage level to an unselected wordline associated with the plurality of memory cells during the body reset operation. The selected wordline can transit to a stable negative pillar potential, such that selected memory cells associated with the selected wordline have a reduced threshold voltage instability.

In one example of the system, the second voltage level is applied to the unselected wordline during the body reset operation to cause the unselected wordline to have a negative pillar potential, wherein the negative pillar potential for the unselected wordline transits to an increased pillar potential over a period of time.

In one example of the system, the body reset operation occurs at source-side memory cells included in the plurality of memory cells, thereby causing a neutral pillar potential at the source-side memory cells prior to a program-inhibit operation for mitigating a program disturbance.

In one example of the system, the body reset operation functions to stabilize a pillar potential for the selected wordline.

In one example of the system, the first voltage level is higher than the second voltage level.

In one example of the system, the body reset operation is performed prior to a program and verify operation, or the body reset operation is performed subsequent to a program and verify operation.

In one example of the system, the body reset operation is performed prior to a read operation, or the body reset operation is performed subsequent to a read operation.

In one example of the system, the plurality of memory cells includes a plurality of quad-level cells (QLCs).

In one example there is provided a memory device operable to program memory cells in the memory device. The memory device can comprise a plurality of memory cells. The memory device can comprise a memory controller. The memory controller can comprise logic to apply a first voltage level to a selected wordline associated with the plurality of memory cells during a body reset operation. The memory controller can comprise logic to apply a second voltage level to an unselected wordline associated with the plurality of memory cells during the body reset operation, wherein the selected wordline transits to a stable negative pillar potential, such that selected memory cells associated with the selected wordline have a reduced threshold voltage instability.

In one example of the memory device, the second voltage level is applied to the unselected wordline during the body reset operation to cause the unselected wordline to have a negative pillar potential, wherein the negative pillar potential for the unselected wordline transits to an increased pillar potential over a period of time.

In one example of the memory device, the body reset operation occurs at source-side memory cells included in the plurality of memory cells, thereby causing a neutral pillar potential at the source-side memory cells prior to a program-inhibit operation for mitigating a program disturbance.

In one example of the memory device, the body reset operation functions to stabilize a pillar potential for the selected wordline.

In one example of the memory device, the first voltage level is higher than the second voltage level.

In one example of the memory device, the body reset operation is performed prior to a program and verify operation, or the body reset operation is performed subsequent to a program and verify operation.

In one example of the memory device, the body reset operation is performed prior to a read operation, or the body reset operation is performed subsequent to a read operation.

In one example of the memory device, the plurality of memory cells includes a plurality of quad-level cells (QLCs).

In one example of the memory device, the memory device is a three-dimensional (3D) NAND flash memory device.

In one example there is provided a three-dimensional (3D) NAND flash memory device operable to program memory cells in the 3D NAND flash memory device. The 3D NAND flash memory device can comprise a plurality of memory cells. The 3D NAND flash memory device can comprise a memory controller. The memory controller can comprise logic to apply a first voltage level to a selected wordline associated with the plurality of memory cells during a body reset operation, wherein the body reset operation functions to stabilize a pillar potential for the selected wordline. The memory controller can comprise logic to apply a second voltage level to an unselected wordline associated with the plurality of memory cells during the body reset operation, wherein the first voltage level is higher than the second voltage level, wherein the first voltage level and the second voltage level are applied during the body reset operation to cause the selected wordline to transit to a stable negative pillar potential, such that selected memory cells associated with the selected wordline have a more stable threshold voltage.

In one example of the 3D NAND flash memory device, the second voltage level is applied to the unselected wordline during the body reset operation to cause the unselected wordline to have a negative pillar potential, wherein the negative pillar potential for the unselected wordline transits to an increased pillar potential over a period of time.

In one example of the 3D NAND flash memory device, the body reset operation occurs at source-side memory cells included in the plurality of memory cells, thereby causing a neutral pillar potential at the source-side memory cells prior to a program-inhibit operation for mitigating a program disturbance.

In one example of the 3D NAND flash memory device, the body reset operation is performed prior to a program and verify operation, or the body reset operation is performed subsequent to a program and verify operation.

In one example of the 3D NAND flash memory device, the body reset operation is performed prior to a read operation, or the body reset operation is performed subsequent to a read operation.

In one example of the 3D NAND flash memory device, the plurality of memory cells includes a plurality of quad-level cells (QLCs).

In one example there is provided a method for programming memory cells in a memory device. The method can include applying, at a memory controller of a memory device, a first voltage level to a selected wordline associated with the plurality of memory cells during a body reset operation, wherein the body reset operation functions to stabilize a pillar potential for the selected wordline. The method can include applying, at the memory controller, a second voltage level to an unselected wordline associated with the plurality of memory cells during the body reset operation, wherein the first voltage level is higher than the second voltage level, wherein the first voltage level and the second voltage level are applied during the body reset operation to cause the selected wordline to transit to a stable negative pillar potential, such that selected memory cells associated with the selected wordline have a more stable threshold voltage.

In one example of the method for programming memory cells in the memory device, the second voltage level is applied to the unselected wordline during the body reset operation to cause the unselected wordline to have a negative pillar potential, wherein the negative pillar potential for the unselected wordline transits to an increased pillar potential over a period of time.

In one example of the method for programming memory cells in the memory device, the body reset operation occurs at source-side memory cells included in the plurality of memory cells, thereby causing a neutral pillar potential at the source-side memory cells prior to a program-inhibit operation for mitigating a program disturbance.

In one example of the method for programming memory cells in the memory device, the body reset operation is performed prior to a program and verify operation, or the body reset operation is performed subsequent to a program and verify operation.

In one example of the method for programming memory cells in the memory device, the body reset operation is performed prior to a read operation, or the body reset operation is performed subsequent to a read operation.

In one example of the method for programming memory cells in the memory device, the plurality of memory cells includes a plurality of quad-level cells (QLCs).

In one example of the method for programming memory cells in the memory device, the memory device is a three-dimensional (3D) NAND flash memory device.

While the forgoing examples are illustrative of the principles of invention embodiments in one or more particular applications, it will be apparent to those of ordinary skill in the art that numerous modifications in form, usage and details of implementation can be made without the exercise of inventive faculty, and without departing from the principles and concepts of the disclosure.

What is claimed is:

1. A system operable to program memory cells, the system comprising:
    a plurality of memory cells, wherein a memory cell in the plurality of memory cells is associated with a wordline, a bitline, a source line, a select gate drain (SGD) device and a select gate source (SGS) device; and
    a memory controller communicatively coupled to the plurality of memory cells, the memory controller comprising logic to:
        apply a first voltage level to a selected wordline associated with the plurality of memory cells during a body reset operation; and
        apply a second voltage level to an unselected wordline associated with the plurality of memory cells during the body reset operation to cause the unselected wordline to have a negative pillar potential, wherein the negative pillar potential for the unselected wordline transits to an increased pillar potential over a period of time,
        wherein the selected wordline transits to a stable negative pillar potential, such that selected memory cells associated with the selected wordline have a reduced threshold voltage instability.

2. The system of claim 1, wherein the body reset operation occurs at source-side memory cells included in the plurality of memory cells, thereby causing a neutral pillar potential at the source-side memory cells prior to a program-inhibit operation for mitigating a program disturbance.

3. The system of claim 1, wherein the body reset operation functions to stabilize a pillar potential for the selected wordline.

4. The system of claim 1, wherein the first voltage level is higher than the second voltage level.

5. The system of claim 1, wherein the body reset operation is performed prior to a program and verify operation, or the body reset operation is performed subsequent to a program and verify operation.

6. The system of claim 1, wherein the body reset operation is performed prior to a read operation, or the body reset operation is performed subsequent to a read operation.

7. The system of claim 1, wherein the plurality of memory cells includes a plurality of quad-level cells (QLCs).

8. A memory device operable to program memory cells in the memory device, the memory device comprising:
    a plurality of memory cells, wherein a memory cell in the plurality of memory cells is associated with a wordline, a bitline, a source line, a select gate drain (SGD) device and a select gate source (SGS) device; and
    a memory controller communicatively coupled to the plurality of memory cells, the memory controller comprising logic to:
        apply a first voltage level to a selected wordline associated with the plurality of memory cells during a body reset operation; and
        apply a second voltage level to an unselected wordline associated with the plurality of memory cells during the body reset operation to cause the unselected wordline to have a negative pillar potential, wherein the negative pillar potential for the unselected wordline transits to an increased pillar potential over a period of time,
        wherein the selected wordline transits to a stable negative pillar potential, such that selected memory cells associated with the selected wordline have a reduced threshold voltage instability.

9. The memory device of claim 8, wherein the body reset operation occurs at source-side memory cells included in the plurality of memory cells, thereby causing a neutral pillar potential at the source-side memory cells prior to a program-inhibit operation for mitigating a program disturbance.

10. The memory device of claim 8, wherein the body reset operation functions to stabilize a pillar potential for the selected wordline.

11. The memory device of claim 8, wherein the first voltage level is higher than the second voltage level.

12. The memory device of claim 8, wherein the body reset operation is performed prior to a program and verify operation, or the body reset operation is performed subsequent to a program and verify operation.

13. The memory device of claim 8, wherein the body reset operation is performed prior to a read operation, or the body reset operation is performed subsequent to a read operation.

14. The memory device of claim 8, wherein the plurality of memory cells includes a plurality of quad-level cells (QLCs).

15. The memory device of claim 8, wherein the memory device is a three-dimensional (3D) NAND flash memory device.

16. A three-dimensional (3D) NAND flash memory device operable to program memory cells in the 3D NAND flash memory device, comprising:
    a plurality of memory cells, wherein a memory cell in the plurality of memory cells is associated with a wordline, a bitline, a source line, a select gate drain (SGD) device and a select gate source (SGS) device; and
    a memory controller communicatively coupled to the plurality of memory cells, the memory controller comprising logic to:
        apply a first voltage level to a selected wordline associated with the plurality of memory cells during a body reset operation, wherein the body reset operation functions to stabilize a pillar potential for the selected wordline; and
        apply a second voltage level to an unselected wordline associated with the plurality of memory cells during the body reset operation, wherein the first voltage level is higher than the second voltage level,
        wherein the first voltage level and the second voltage level are applied during the body reset operation to cause the selected wordline to transit to a stable negative pillar potential, such that selected memory cells associated with the selected wordline have a more stable threshold voltage.

17. The 3D NAND flash memory device of claim 16, wherein the second voltage level is applied to the unselected wordline during the body reset operation to cause the unselected wordline to have a negative pillar potential, wherein the negative pillar potential for the unselected wordline transits to an increased pillar potential over a period of time.

18. The 3D NAND flash memory device of claim 16, wherein the body reset operation occurs at source-side memory cells included in the plurality of memory cells, thereby causing a neutral pillar potential at the source-side memory cells prior to a program-inhibit operation for mitigating a program disturbance.

19. The 3D NAND flash memory device of claim 16, wherein the body reset operation is performed prior to a program and verify operation, or the body reset operation is performed subsequent to a program and verify operation.

20. The 3D NAND flash memory device of claim 16, wherein the body reset operation is performed prior to a read operation, or the body reset operation is performed subsequent to a read operation.

21. The 3D NAND flash memory device of claim 16, wherein the plurality of memory cells includes a plurality of quad-level cells (QLCs).

* * * * *